(12) United States Patent
Okutani et al.

(10) Patent No.: US 7,960,908 B2
(45) Date of Patent: Jun. 14, 2011

(54) ORGANIC EL DISPLAY

(75) Inventors: Satoshi Okutani, Ishikawa-gun (JP);
Hirofumi Kubota, Kanazawa (JP);
Tsuyoshi Uemura, Kanazawa (JP)

(73) Assignee: Toshiba Matsushita Display Technology Co., Ltd., Tokyo (JP)

( * ) Notice: Subject to any disclaimer, the term of this patent is extended or adjusted under 35 U.S.C. 154(b) by 1059 days.

(21) Appl. No.: 11/456,415

(22) Filed: Jul. 10, 2006

(65) Prior Publication Data
US 2007/0013282 A1    Jan. 18, 2007

(30) Foreign Application Priority Data

Jul. 15, 2005    (JP) .................................. 2005-206958
Jul. 21, 2005    (JP) .................................. 2005-211354

(51) Int. Cl.
*H01L 51/50* (2006.01)
(52) U.S. Cl. ........ 313/504; 313/506; 313/111; 313/112; 313/113
(58) Field of Classification Search .......... 313/111–113, 313/504, 506
See application file for complete search history.

(56) References Cited

U.S. PATENT DOCUMENTS

| | | | | |
|---|---|---|---|---|
| 6,831,409 B2* | 12/2004 | Yamada | ......................... | 313/506 |
| 2002/0171792 A1* | 11/2002 | Kubota et al. | .................. | 349/114 |
| 2004/0119400 A1* | 6/2004 | Takahashi et al. | ............ | 313/504 |
| 2005/0073228 A1* | 4/2005 | Tyan et al. | ..................... | 313/110 |
| 2005/0116619 A1* | 6/2005 | Kuma et al. | .................... | 313/503 |
| 2005/0218799 A1* | 10/2005 | Hamada | ......................... | 313/506 |
| 2005/0225237 A1* | 10/2005 | Winters | ......................... | 313/506 |
| 2005/0275343 A1* | 12/2005 | Tanaka et al. | .................. | 313/504 |
| 2005/0275346 A1* | 12/2005 | Eida et al. | ...................... | 313/504 |
| 2006/0062270 A1 | 3/2006 | Okutani et al. | | |
| 2006/0092679 A1 | 5/2006 | Miyatake et al. | | |
| 2007/0001587 A1* | 1/2007 | Hatwar et al. | ................. | 313/504 |

FOREIGN PATENT DOCUMENTS

| | | |
|---|---|---|
| JP | 11-214158 | 8/1999 |
| JP | 2002-270365 | 9/2002 |
| JP | 2005-129510 | 5/2005 |
| JP | 2005-156871 | 6/2005 |
| WO | WO 2006/035625 A1 | 4/2006 |
| WO | WO 2006/035811 A1 | 4/2006 |
| WO | WO 2006/035956 A1 | 4/2006 |

OTHER PUBLICATIONS

U.S. Appl. No. 11/670,223, filed Feb. 1, 2007, Okutani, et al.
U.S. Appl. No. 11/670,004, filed Feb. 1, 2007, Okutani, et al.
U.S. Appl. No. 11/693,399, filed Mar. 29, 2007, Okada, et al.
Mitsuhiro Kashiwabara, et al., "29.5L: Late-News Paper: Advanced AM-OLED Display Based on White Emitter with Microcavity Structure", SID 04 Digest, 2004, pp. 1017-1019.
Office Action issued Jul. 6, 2010, in Japan Patent Application No. 2005-211354 (with English-language Translation).

* cited by examiner

*Primary Examiner* — Nimeshkumar D Patel
*Assistant Examiner* — Mary Ellen Bowman
(74) *Attorney, Agent, or Firm* — Oblon, Spivak, McClelland, Maier & Neustadt, L.L.P.

(57) ABSTRACT

An organic EL display includes an organic EL element including a pair of electrodes and an emitting layer interposed therebetween and having an optical resonator structure, and a coloring layer facing the organic EL element. A wavelength $\lambda_{res}$ of a light component with the maximum intensity that the organic EL element emits in a normal direction is shorter than a wavelength at which the coloring layer exhibits the maximum transmittance.

6 Claims, 7 Drawing Sheets

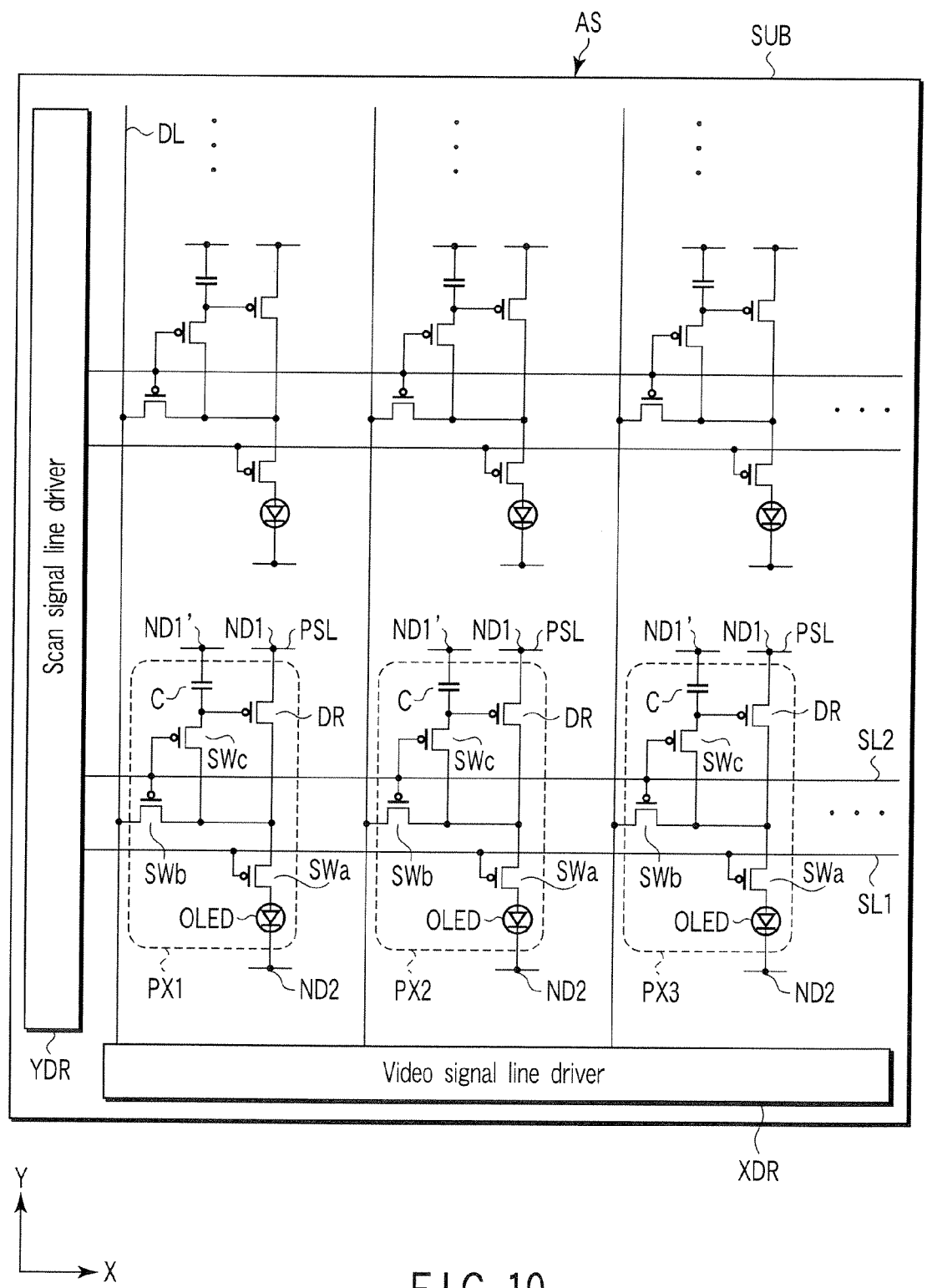
F I G. 10

ORGANIC EL DISPLAY

CROSS-REFERENCE TO RELATED APPLICATIONS

This application is based upon and claims the benefit of priority from prior Japanese Patent Applications No. 2005-206958, filed Jul. 15, 2005; and No. 2005-211354, filed Jul. 21, 2005, the entire contents of both of which are incorporated herein by reference.

BACKGROUND OF THE INVENTION

1. Field of the Invention

The present invention relates to an organic electroluminescent (hereinafter referred to as EL) display.

2. Description of the Related Art

An organic EL display in which organic EL elements emitting white light and a color filter are used in combination is one of displays that can display a color image. Kashiwabara et al. describe in "Advanced AM-OLED Display Based on White Emitter with Microcavity Structure", SID 04 DIGEST, pp. 1017-1019 that organic EL elements with microcavity structures, i.e., organic EL elements each having a function of an optical resonator are used in such an organic EL display.

When a microcavity structure is employed in an organic EL element that emits white light, a light component having a certain wavelength increases its intensity due to multiple-beam interference. That is, when a microcavity structure is employed in an organic EL element emitting white light, the light that the organic EL element emits outwardly changes from white light to colored light.

The wavelength at which intensity of light is increased is changed according to an optical length of the microcavity structure. Therefore, by individually setting the optical lengths of the microcavity structures in consideration of each coloring layer of the color filter, the wavelength of the light component with the maximum intensity that each microcavity structure emits can be matched with the wavelength at which the corresponding coloring layer of the color filter exhibits the maximum transmittance. Thus, according to the techniques, high degrees of efficiency and chroma can be achieved.

However, the present inventor has found the following facts in achieving the present invention. That is, an image displayed on the organic EL display is significantly dark when the image is viewed in an oblique direction as compared to the case when the image is viewed in the normal direction. In addition, the hue of the image displayed on the organic EL display changes when the viewing direction is changed from the normal direction to the oblique direction. That is, the organic EL display has high dependence of hue and luminance on the viewing direction despite the use of the color filter.

BRIEF SUMMARY OF THE INVENTION

According to a first aspect of the present invention, there is provided an organic EL display comprising an organic EL element including a pair of electrodes and an emitting layer interposed therebetween, the organic EL element having an optical resonator structure, and a coloring layer facing the organic EL element, a wavelength $\lambda_{res}$ of a light component with the maximum intensity that the organic EL element emits in a normal direction being shorter than a wavelength $\lambda_{max}$ at which the coloring layer exhibits the maximum transmittance $T_{max}$.

According to a second aspect of the present invention, there is provided an organic EL display comprising first to third pixels each comprising an organic EL element and a coloring layer, the organic EL element including a front electrode, a back electrode, and an emitting layer interposed therebetween and having an optical resonator structure, and the coloring layer facing the front electrode, the first pixel emitting a shorter wavelength $\lambda_{res}$ of a light component with the maximum intensity that the organic EL element emits in a normal direction than the second pixel, the third pixel emitting a longer wavelength $\lambda_{res}$ than the second pixel, the first pixel emitting a shorter wavelength $\lambda_{max}$ at which the coloring layer exhibits the maximum transmittance $T_{max}$ than the second pixel, the third pixel being longer in the wavelength $\lambda_{max}$ than the second pixel, and the wavelength $\lambda_{res}$ being shorter than the wavelength $\lambda_{max}$ in each of the first to third pixels.

According to a third aspect of the present invention, there is provided an organic EL display comprising organic EL elements each having an optical resonator structure, a color filter facing the organic EL elements, and a light-scattering layer facing the organic EL elements with the color filter interposed therebetween.

According to a fourth aspect of the present invention, there is provided an organic EL display comprising organic EL elements each including a first and second electrodes and an emitting layer interposed therebetween and each having an optical resonator structure, a light-scattering layer facing the first electrode, and a color filter including coloring layers and interposed between the first electrode and the light-scattering layer, each of the coloring layers having a smaller refractive index than the first electrode.

According to a fifth aspect of the present invention, there is provided an organic EL display comprising first to third pixels each comprising an organic EL element having an optical resonator structure and a coloring layer facing the organic EL element, the organic EL element including an emitting layer emitting white light, and a light-scattering layer facing the organic EL element with the coloring layer interposed therebetween, the first pixel emitting a shorter wavelength $\lambda_{res}$ of a light component with the maximum intensity that the organic EL element emits in a normal direction than the second pixel, the third pixel emitting a longer wavelength $\lambda_{res}$ than the second pixel, the first pixel emitting a shorter wavelength $\lambda_{max}$ at which the coloring layer exhibits the maximum transmittance $T_{max}$ than the second pixel, and the third pixel emitting a longer wavelength $\lambda_{max}$ than the second pixel.

BRIEF DESCRIPTION OF THE SEVERAL VIEWS OF THE DRAWING

FIG. 10 is a plan view schematically showing a display according to a second embodiment of the present invention;

DETAILED DESCRIPTION OF THE INVENTION

Figure 1:
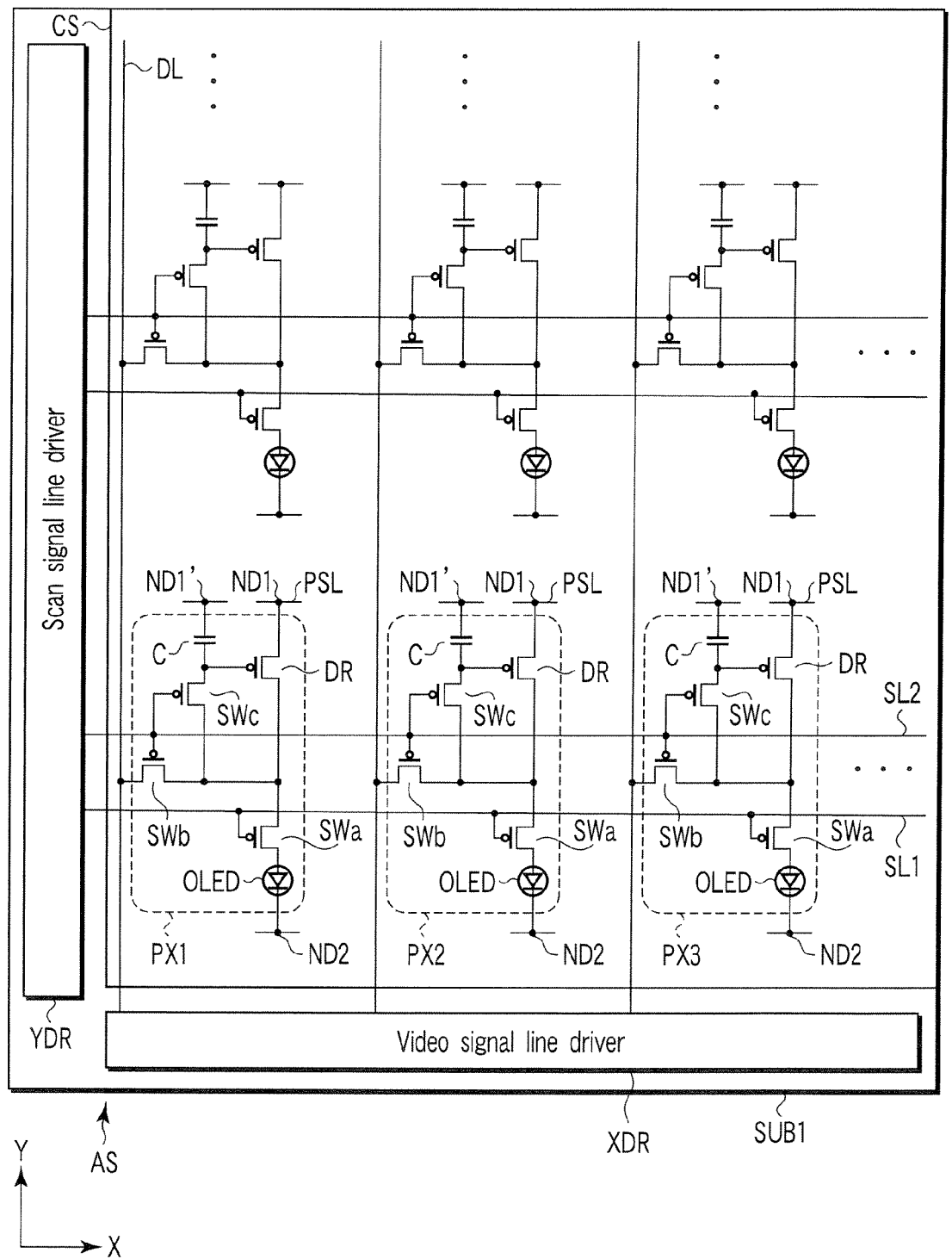
FIG. 1 is a plan view schematically showing a display according to a first embodiment of the present invention.

Embodiments of the present invention will be described below in detail with reference to the drawings. In the drawings, components having the same or similar function are denoted by the same reference symbol and duplicate descriptions will be omitted.

Figure 2:
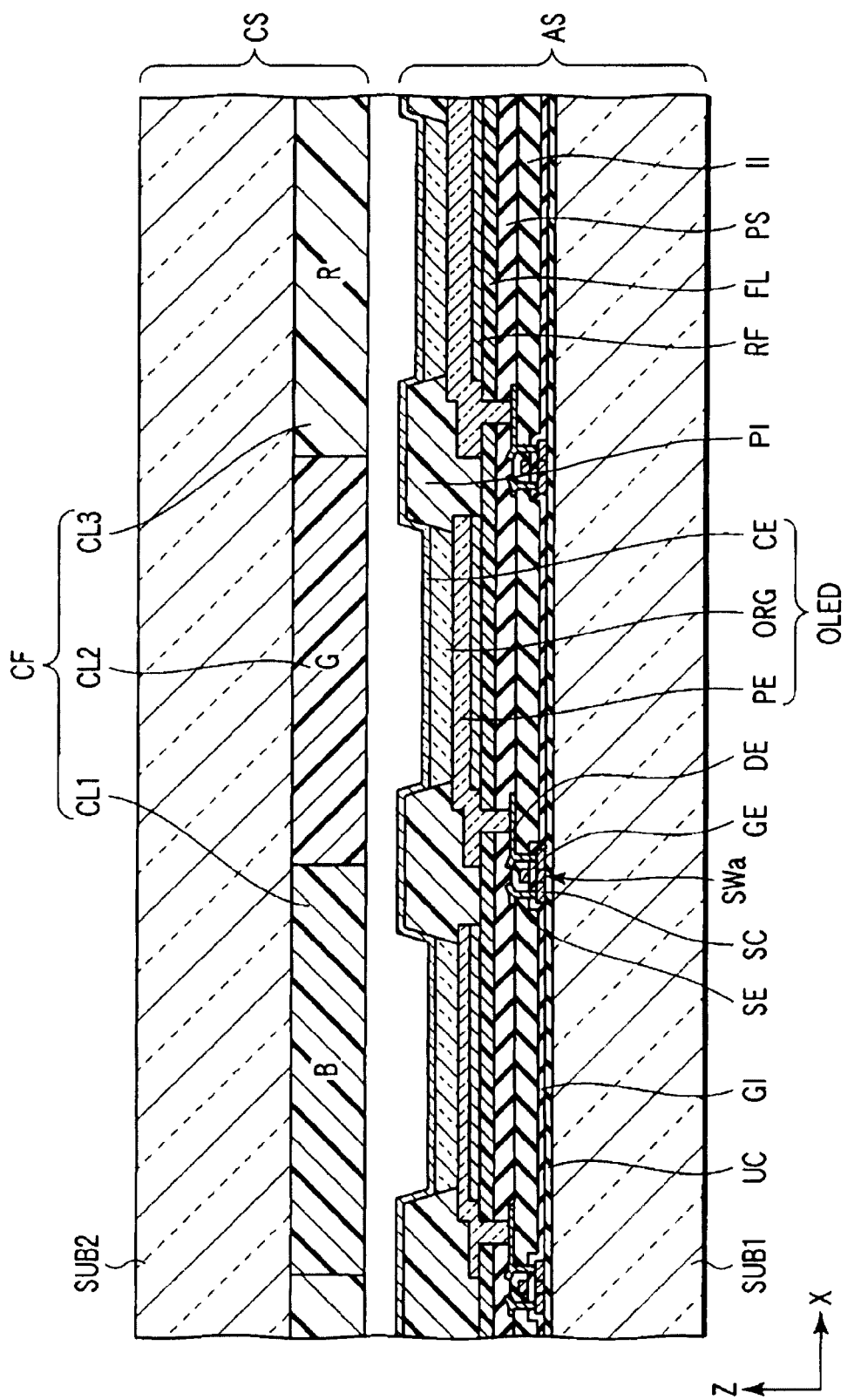
FIG. 2 is a sectional view schematically showing an example of the structure that can be employed in the display shown in FIG. 1.

FIG. 1 is a plan view schematically showing a display according to a first embodiment of the present invention. FIG. 2 is a sectional view schematically showing an example of the structure that can be employed in the display shown in FIG. 1. In FIG. 2, the display is drawn such that its display surface, i.e., the front surface or light-emitting surface, faces upwardly and its back surface faces downwardly.

The display is a top emission organic EL display that employs an active matrix driving method. As described later, the organic EL display includes pixels PX1 to PX3 different in display color from one another. The pixels PX1 to PX3 include organic EL elements OLED, and further include coloring layers CL1 to CL3 of a color filter CF, respectively.

The organic EL display includes an array substrate AS, a sealing substrate CS, a video signal line driver XDR, and a scan signal line driver YDR.

The array substrate AS includes an insulating substrate SUB1 such as glass substrate.

On the substrate SUB 1, an undercoat layer UC is formed as shown in FIG. 2. For example, the undercoat layer UC is formed by sequentially stacking an $SiN_x$ layer and an $SiO_y$ layer on the substrate SUB1.

On the undercoat layer UC, semiconductor layers SC are arranged. A source and drain are formed in each semiconductor layer SC. The semiconductors SC are, for example, polysilicon layers.

The undercoat layer UC and the semiconductor layers SC are covered with an insulating film GI. The insulating film GI is utilized as gate insulators. The insulating film GI is formed, for example, by using tetraethyl orthosilicate (TEOS).

On the insulating film GI, gates GE are arranged correspondently with the semiconductor layers SC. For example, the gates GE are made of MoW.

The semiconductor layers SC, the insulating film GI and the gates GE form top-gate type p-channel thin-film transistors, which are field-effect transistors. In the present embodiment, the thin-film transistors are p-channel thin-film transistors and utilized as drive control elements DR and switches SWa to SWc shown in FIG. 1.

On the insulating film GI, scan signal lines SL1 and SL2 shown in FIG. 1 and lower electrodes (not shown) are further arranged. The scan signal lines SL1 and SL2 and the lower electrodes can be formed in the same step as that for the gates GE.

As shown in FIG. 1, the scan signal lines SL1 and SL2 extend in a direction (X direction) along rows of the pixels PX1 to PX3 and alternately arranged in a direction (Y direction) along columns of the pixels PX1 to PX3. The scan signal lines SL1 and SL2 are connected to the scan signal line driver YDR.

The lower electrodes are connected to the gates of the drive control elements DR, respectively. Each lower electrode is utilized as an electrode of a capacitor C described later.

The insulating film GI, the gates GE, the scan signal lines SL1 and SL2, and the lower electrodes are covered with an interlayer insulating film II shown in FIG. 2. The interlayer insulating film II is, for example, an $SiO_x$ layer formed by plasma chemical vapor deposition. The parts of the interlayer insulating film II on the lower electrodes are utilized as dielectric layers of the capacitors C.

On the interlayer insulating film II, source electrodes SE and drain electrodes DE shown in FIG. 2, video signal lines DL and power supply lines PSL shown in FIG. 1, and upper electrodes (not shown) are arranged. These components can be formed in the same step and each has a three-layered structure of Mo/Al/Mo, for example.

The source electrodes SE are electrically connected to the sources of the thin-film transistors via contact holes formed in the interlayer insulating film II.

The drain electrodes DE are electrically connected to the drains of the thin-film transistors via contact holes formed in the interlayer insulating film II.

As shown in FIG. 1, the video signal lines DL extend in the Y direction and are arranged in the X direction. An end of each video signal line DL is connected to the video signal line driver XDR.

In the present embodiment, the power supply lines PSL extend in the X direction and are arranged in the Y direction. Instead, the power supply lines PSL may extend in the Y direction and be arranged in the X direction. In the present embodiment, the power supply lines PSL are connected to the video signal line driver XDR. Instead, the power supply lines PSL may be connected to the scan signal line driver YDR.

The upper electrodes are connected to the power supply lines. Each upper electrode is utilized as another electrode of the capacitor C.

The source electrodes SE, the drain electrodes DE, the video signal lines DL, the power supply lines PSL, and the upper electrodes are covered with a passivation film PS shown in FIG. 2. The passivation film PS is made of $SiN_x$, for example.

On the passivation film PS, an flattening layer FL is formed. The flattening layer FL is made of hard resin, for example.

On the flattening layer FL, reflective layers RF are arranged correspondently with the switches SWa. As a material of the reflective layers RF, a metallic material such as AL is used, for example.

On the reflective layers RF, light-transmitting pixel electrodes PE as back electrodes are formed. The pixel electrodes PE are connected to the drain electrodes DE of the switches SWa via through-holes formed in the flattening layer FL and the passivation film PS.

In the present embodiment, the pixel electrodes PE are anodes. As a material of the pixel electrodes PE, a transparent conductive oxide such as indium tin oxide (hereinafter referred to ITO) is formed, for example.

On the flattening layer FL, a partition insulating layer PI shown in FIG. 2 is further formed. The partition insulating layer PI is provided with through-holes at positions corresponding to the pixel electrodes PE. Alternatively, the partition insulating layer PI is provided with slits at positions corresponding to columns or rows of the pixel electrodes PE. As an example, it is supposed that through-holes are formed in the partition insulating layer PI at positions corresponding to the pixel electrodes PE.

The partition insulating layer PI is, for example, an organic insulating layer. The partition insulating layer PI can be formed by using photolithography technique, for example.

On the pixel electrodes PE, organic layers ORG including emitting layers are formed as active layers. The emitting layers are thin films designed to emit white light. For example, the emitting layers contain a mixture of a luminescent organic compound emitting red light, a luminescent organic compound emitting green light, and a luminescent organic compound emitting blue light. Each organic layer ORG can further include a hole injection layer, a hole transporting layer, a hole blocking layer, an electron transporting layer, and an electron injection layer in addition to the emitting layer.

The partition insulating layer PI and the organic layers ORG are covered with a counter electrode CE as a front electrode. The counter electrode CE is a common electrode shared among the pixels PX1 to PX3, and is a semi-transparent cathode in the present embodiment. Note that "a semi-transparent electrode" means an electrode having light-transmitting and light-reflecting properties. For example, an electrode wire (not shown) is formed on the layer on which the video signal lines DL are formed, and the counter electrode CE is electrically connected to the electrode wire via a contact hole formed in the passivation layer PS, flattening layer FL and partition insulating layer PI. Each organic EL element OLED is composed of the pixel electrode PE, organic layer ORG, and counter electrode CE.

The organic EL elements OLED have optical resonator structures, i.e. microcavity structures. In the present embodiment, a configuration in which light emitted by the organic layer ORG causes multi-beam interference between the reflective layer RF and the counter electrode CE is employed.

The organic EL elements OLED included in the pixels PX1 are shorter in optical length between the reflective layer RF and the counter electrode CE than the organic EL element OLED included in the pixels PX2. The organic EL elements OLED included in the pixels PX3 are longer in optical length between the reflective layer RF and the counter electrode CE than the organic EL element OLED included in the pixels PX2. As an example, the differences in the optical length are produced only by making the thickness of the pixel electrodes PE differ among the pixels PX1 to PX3. Such a structure can be obtained, for example by forming the pixel electrodes PE of the pixels PX1 through one film formation, forming the pixel electrodes PE of the pixels PX2 through two film formations, and forming the pixel electrodes PE of the pixels PX3 through three film formations.

The difference in the optical length may be produced only by placing transparent insulating layers made of an inorganic insulator such as $SiN_x$ and $SiO_y$, or an organic insulator such as photosensitive resin between the pixel electrodes PE and the reflective layers RF, and making the transparent insulating layers differ in thickness among the pixels PX1 to PX3. Alternatively, the difference in the optical length may be produced only by making the organic layers ORG differ in thickness among the pixel PX1 to PX3. Alternatively, their combination may be employed.

The pixels PX1 are short in wavelength $\lambda_{res}$ of the light component with the maximum intensity that the organic EL element OLED emits in the normal direction as compared with the pixels PX2. The pixels PX3 are long in wavelength $\lambda_{res}$ of the light component with the maximum intensity that the organic EL element OLED emits in the normal direction as compared with the pixels PX2. As an example, the wavelength $\lambda_{res}$ of the organic EL elements OLED included in the pixels PX1 falls within the wavelength range of blue light, the wavelength $\lambda_{res}$ of the organic EL elements OLED included in the pixels PX2 falls within the wavelength range of green light, and the wavelength $\lambda_{res}$ of the organic EL elements OLED included in the pixels PX3 falls within the wavelength range of red light.

Each pixel circuit of the pixels PX1 to PX3 includes the drive control element (drive transistor) DR, the output control switch SWa, the video signal supply control switch SWb, the diode-connecting switch SWc, and the capacitor C. As described above, in the present embodiment, the drive control element DR and the switches SWa to SWc are p-channel thin-film transistors. Also, in the present embodiment, the video signal supply control switch SWb and the diode-connecting switch SWc form a switch group that switches between a first state in which the drain of the drive control element DR, the video signal line DL, and the gate of the drive control element DR are connected to one another and a second state in which they are disconnected from one another.

The drive control element DR, the output control switch SWa, and the organic EL element OLED are connected in series between a first power supply terminal ND1 and a second power supply terminal ND2 in this order. In this embodiment, the power supply terminal ND1 is a high-potential power supply terminal, and the power supply terminal ND2 is a low-potential power supply terminal.

The gate of the output control switch SWa is connected to the scan signal line SL1. The video signal supply control switch SWb is connected between the video signal line DL and the drain of the drive control element DR, and its gate is connected to the scan signal line SL2. The diode-connecting switch SWc is connected between the gate and drain of the drive control element DR, and its gate is connected to the scan signal line SL2.

The capacitor C is connected between the gate of the drive control element DR and a constant-potential terminal ND1'. For example, the constant-potential terminal ND1' is connected to the power supply terminal ND1.

The sealing substrate includes an insulating substrate SUB2 such as glass substrate. The substrate SUB2 faces the conter electrode CE.

On a surface of the substrate SUB2 that faces the array substrate AS, the color filter CF including the coloring layers CL1 to CL3 is placed. Each of the coloring layer CL1 to CL3 faces the organic EL elements OLED.

Each pixel PX1 includes the organic EL element OLED and the coloring layer CL1 facing it. Each pixel PX2 includes the organic EL element OLED and the coloring layer CL2 facing it. Each pixel PX3 includes the organic EL element OLED and the coloring layer CL3 facing it.

The coloring layers CL1 are short in wavelength $\lambda_{max}$ at which the maximum transmittance $T_{max}$ is obtained as compared to the coloring layers CL2. The coloring layers CL3 are long in wavelength $\lambda_{max}$ at which the maximum transmittance $T_{max}$ is obtained as compared to the coloring layers CL2. As an example, the wavelength $\lambda_{max}$ at which the coloring layers CL1 exhibit the maximum transmittance $T_{max}$ falls within the wavelength range of blue light, the wavelength $\lambda_{max}$ at which the coloring layers CL2 exhibit the maximum transmittance $T_{max}$ falls within the wavelength range of green light, and the wavelength $\lambda_{max}$ at which the coloring layers CL3 exhibit the maximum transmittance $T_{max}$ falls within the wavelength range of red light.

A frame-shaped sealing layer (not shown) is interposed between the array substrate AS and the sealing substrate CS. The sealing layer forms an enclosed space between the array substrate AS and the sealing substrate CS, and the enclosed space is filled with an inert gas. Note that the enclosed space may be filled with a resin such as epoxy resin instead of the inert gas. In this case, a barrier layer made of $SiN_x$ and the like may be formed on the counter electrode CE.

In the present embodiment, the video signal line driver XDR and the scan signal line driver YDR are placed on the array substrate AS. That is, the video signal line driver XDR and the scan signal line driver YDR are connected to the array substrate AS in the chip-on-glass (COG) manner. Instead, the video signal line driver XDR and the scan signal line driver YDR may be connected to the array substrate AS by using the tape carrier package (TCP).

When an image is to be displayed on the organic EL display, the pixels PX1 to PX3 are sequentially selected on a line-by-line basis. A write operation for writing a video signal is executed on each of the selected pixels PX1 to PX3. A display operation for making a drive current flow through the organic EL element OLED is executed on each of the non-selected pixels PX1 to PX3.

During a write period for writing the video signals into the pixels PX1 to PX3 in a certain row, the scan signal line driver YDR outputs a scan signal (off signal) for opening the switches SWa as a voltage signal to the scan signal SL1 to which the pixels PX1 to PX3 are connected. Subsequently, the scan signal line driver YDR outputs a scan signal (on signal) for closing the switches SWb and SWc as a voltage signal to the scan signal line SL2 to which the pixels PX1 to PX3 are connected. In this state, the video signal line driver XDR outputs video signals as current signals to the video signal lines to which the pixels PX1 to PX3 are connected, so as to set the gate-to-source voltages of the drive control elements DR at values corresponding to the video signals. Then, the scan signal line driver YDR outputs a scan signal (off signal) as a voltage signal for opening the switches SWb and SWc to the scan signal line SL2 to which the pixels PX1 to PX3 are connected. Thereafter, the scan signal line driver YDR outputs a scan signal (on signal) as a voltage signal for closing the switches SWa to the scan signal line SL1 to which the pixels PX1 to PX3 are connected.

During the effective display period over which the switches SWa are closed, drive currents flow through the organic EL elements OLED at magnitudes corresponding to the gate-to-source voltages of the drive control elements DR. Each organic EL element OLED emits light at luminance corresponding to the magnitude of the drive current.

In the pixels PX1 of the organic EL display, the wavelength $\lambda_{res}$ of the light component with the maximum intensity that the organic EL element OLED emits in the normal direction is shorter than the wavelength $\lambda_{max}$ at which the coloring layers CL1 exhibit the maximum transmittance $T_{max}$. In the pixels PX2, the wavelength $\lambda_{res}$ of the light component with the maximum intensity that the organic EL element OLED emits in the normal direction is shorter than the wavelength $\lambda_{max}$ at which the coloring layers CL2 exhibit the maximum transmittance $T_{max}$. In the pixels PX3, the wavelength $\lambda_{res}$ of the light component with the maximum intensity that the organic EL element OLED emits in the normal direction is shorter than the wavelength $\lambda_{max}$ at which the coloring layers CL3 exhibit the maximum transmittance $T_{max}$.

Typically, in the pixels PX1, the wavelength $\lambda_{res}$ is shorter than the wavelength $\lambda_{max}$ and is equal to or shorter than the wavelength $\lambda_{90}$ at which the coloring layers CL1 exhibit the transmittance $T_{90}$ that is 90% of the transmittance $T_{max}$. Typically, in the pixels PX2, the wavelength $\lambda_{res}$ is shorter than the wavelength $\lambda_{max}$ and is equal to or shorter than the wavelength $\lambda_{90}$ at which the coloring layers CL2 exhibit the transmittance $T_{90}$ that is 90% of the transmittance $T_{max}$. Typically, in the pixels PX3, the wavelength $\lambda_{res}$ is shorter than the wavelength $\lambda_{max}$ and is equal to or shorter than the wavelength $\lambda_{90}$ at which the coloring layers CL3 exhibit the transmittance $T_{90}$ that is 90% of the transmittance $T_{max}$. Note that the wavelengths $\lambda_{max}$, $\lambda_{res}$ and $\lambda_{90}$ fall within the visible light range.

According to the configuration, the dependence of hue on the viewing direction can be decreased. This will be described below.

Figure 3:
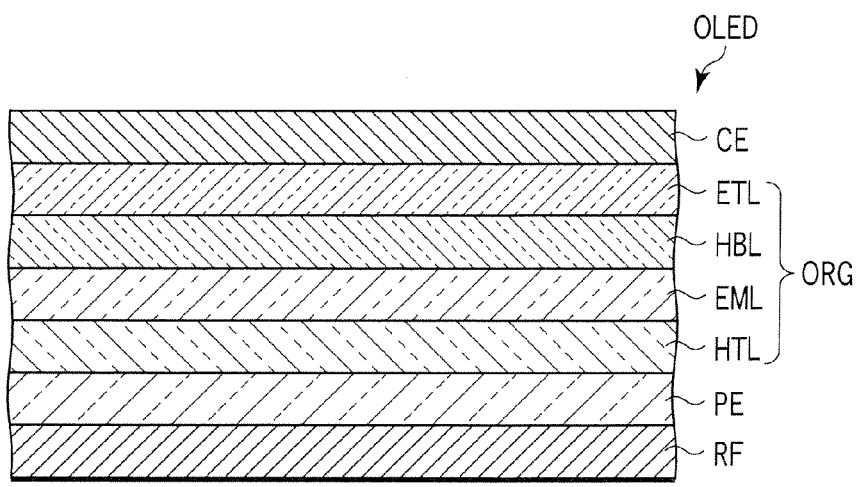
FIG. 3 is a sectional view schematically showing an example of the structure than can be employed in an organic EL element.
Figure 4:
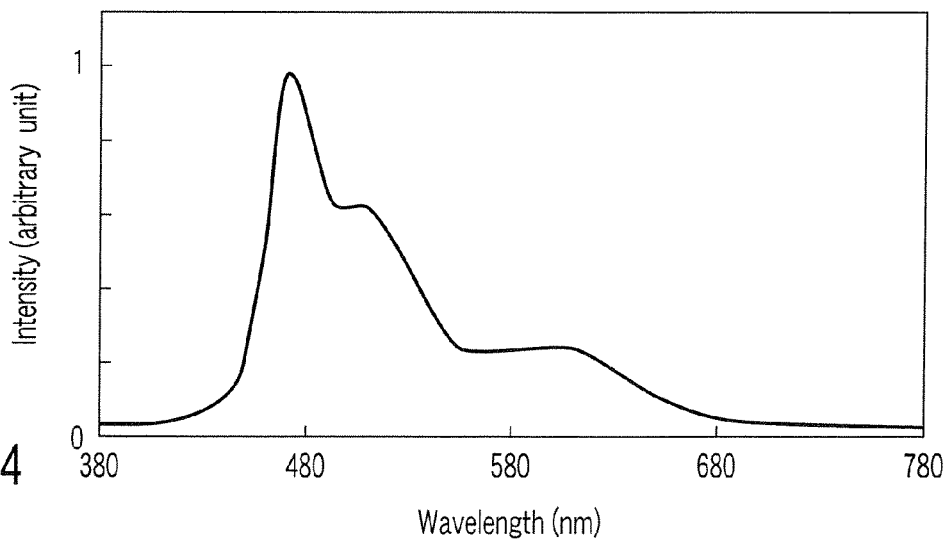
FIG. 4 is a graph showing an example of the emission spectrum of the emitting layer included in the organic EL element shown in FIG. 3.

FIG. 3 is a sectional view schematically showing an example of the structure than can be employed in an organic EL element. FIG. 4 is a graph showing an example of the emission spectrum of the emitting layer included in the organic EL element shown in FIG. 3. In FIG. 4, the abscissa represents a wavelength, while the ordinate represents intensity of light.

In the organic EL element OLED shown in FIG. 3, the organic layer ORG includes the hole transporting layer HTL, the emitting layer EML, the hole blocking layer HBL, and the electron transporting layer ETL. As an example, it is supposed that the hole transporting layer HTL, the emitting layer EML, the hole blocking layer HBL, and the electron transporting layer ETL have refractive indices and thicknesses shown in the following Table 1. It is also supposed that the emission spectrum of the emitting layer EML has the profile shown in FIG. 4.

TABLE 1

|  | Refractive index | Thickness (nm) |
| --- | --- | --- |
| Electron transporting layer | 1.7 | 40 |
| Hole blocking layer | 1.7 | 10 |
| Emitting layer | 1.8 | 30 |
| Hole transporting layer | 1.9 | 50 |
| Pixel electrode | 1.9 | 130 |
| Optical length (nm) |  | 481 |

In the above Table 1, the value in the cell indicated with "Optical length" is the optical length L between the reflective layer RF and the counter electrode CE determined by using the following equation. In the equation, "$\lambda_{res}$" represents the resonant wavelength of the optical resonator that the organic EL element OLED forms, "$\Phi$" represents the sum of phase shifts caused by the reflections on the counter electrode CE and the reflective layer RF, and "m" represents an integer.

$$\frac{2L}{\lambda_{res}} + \frac{\Phi}{2\Pi} = m$$

Figure 5:
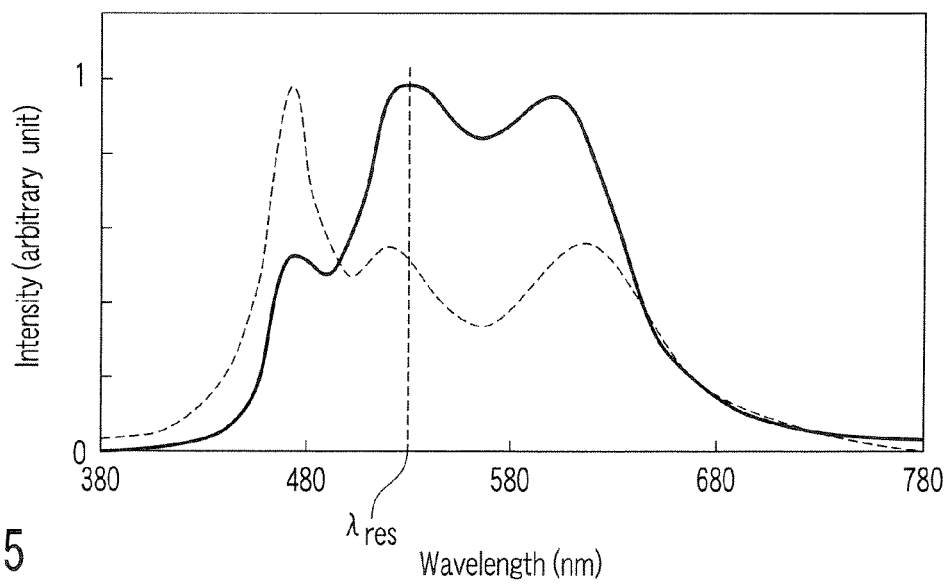
FIG. 5 is a graph showing examples of the emission spectrum of the organic EL element shown in FIG. 3 when the structure shown in Table 1 is employed.

FIG. 5 is a graph showing examples of the emission spectrum of the organic EL element shown in FIG. 3 when the structure shown in Table 1 is employed. In the figure, the abscissa represents the wavelength, while the ordinate represents the intensity of light. In FIG. 5, the solid line is the spectrum of light that the organic EL element OLED emits in the normal direction, while the broken line is the spectrum of light that the organic EL element OLED emits in the direction that forms an angle of 60° with the normal direction. Also, in FIG. 5, the spectrums indicated by the solid line and the broken line are drawn to have the same maximum peak height. Note that the resonant wavelength of light traveling in the normal direction is equal to the wavelength $\lambda_{res}$.

When the configuration shown in Table 1 is employed in the organic EL element OLED shown in FIG. 3, the organic EL element OLED forms an optical resonator with the resonant wavelength of 530 nm, for example. In this case, as is clear from the curve in FIG. 4 and the curve shown by the solid line in FIG. 5, the emission spectrum of the organic EL element OLED greatly differs from the emission spectrum of the emitting layer EML included in the organic EL element OLED.

The resonant wavelength of the optical resonator is dependent on a traveling direction. That is, the resonant wavelength of light that travels in the normal direction within the optical resonator differs from the resonant wavelength of light that travels in an oblique direction within the optical resonator.

The emission spectrum of the emitting layer EML is broad as shown in FIG. 4. Thus, when the organic EL element OLED is observed in an oblique direction, intensity of light components with short wavelengths increases as compared to the case where the organic EL element OLED is observed in the normal direction. In the example shown in FIG. 5, the spectrum of light traveling in the direction that forms an angle of 60° with the normal direction exhibits the maximum intensity at about 480 nm, while the spectrum of light traveling in the normal direction exhibits the maximum intensity at about 530 nm.

Figure 6:
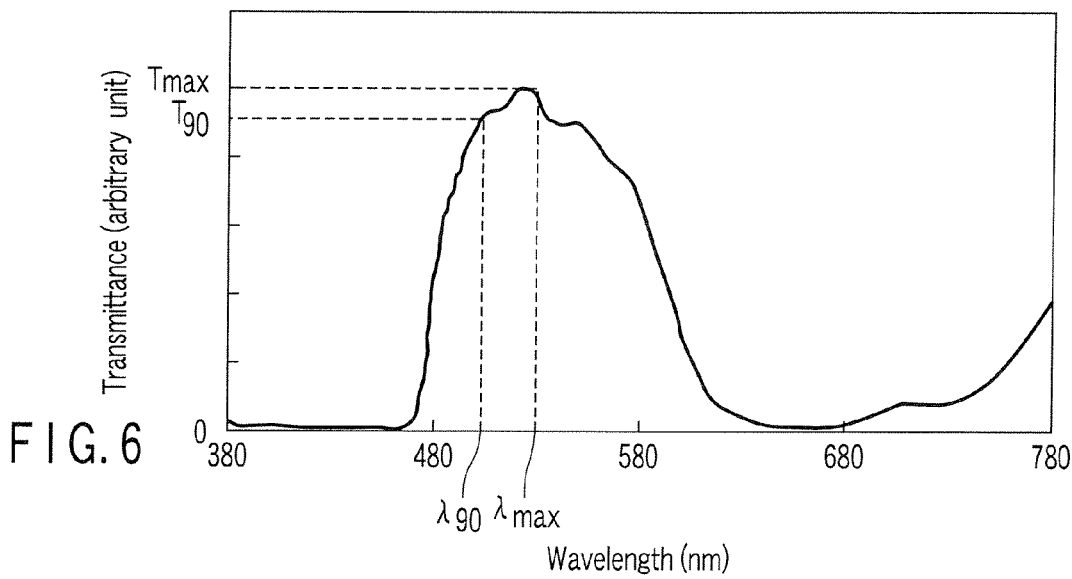
FIG. 6 is a graph showing an example of light transmission properties that a green coloring layer included in a color filter exhibits.
Figure 7:
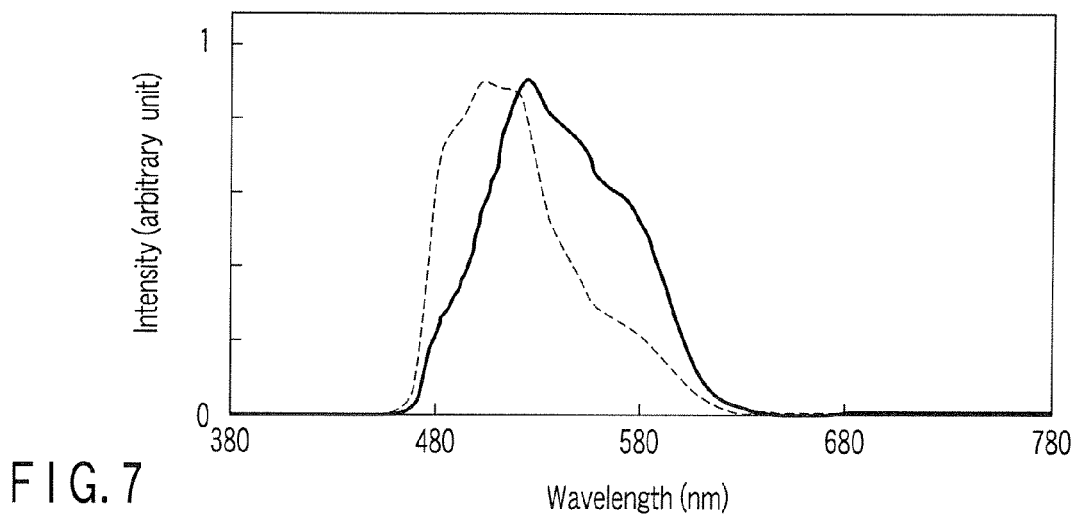
FIG. 7 is a graph showing examples of spectrum of transmitted light when light emitted by the organic EL element employing the structure shown in Table 1 is made to pass through the coloring layer that exhibits the transmission properties shown in FIG. 6.

FIG. 6 is a graph showing an example of light transmission properties that a green coloring layer included in a color filter exhibits. FIG. 7 is a graph showing examples of spectrum of transmitted light when light emitted by the organic EL element employing the structure shown in Table 1 is made to pass through the coloring layer that exhibits the transmission properties shown in FIG. 6. In FIG. 6, the abscissa represents a wavelength, while the ordinate represents transmittance. In FIG. 7, the abscissa represents a wavelength, while the ordinate represents intensity of light. In FIG. 7, the solid line is the spectrum of light that has passed through the green coloring layer and travels in the normal direction, while the broken line is the spectrum of light that has passed through the green coloring layer and travels in the direction that forms an angle of 60° with the normal direction. Also, in FIG. 7, the spectrums indicated by the solid line and the broken line are drawn to have the same maximum peak height.

The green coloring layer whose light transmission properties are shown in FIG. 6 transmits light with a wavelength of about 460 nm to about 660 nm, and exhibits the maximum transmittance $T_{max}$ when the light has a wavelength of about 530 nm (=$\lambda_{max}$). When the light has a wavelength of 480 nm, the transmittance of the green coloring layer is about 50% of the transmittance $T_{max}$.

That is, when the structure shown in Table 1 is employed in the organic EL element OLED shown in FIG. 3, the resonant wavelength of the light that travels within the optical resonator in the normal direction agrees with the wavelength $\lambda_{max}$ at which the coloring layer exhibits the maximum transmittance $T_{max}$. In contrast, at the resonant wavelength of light that travels within the optical resonator in the direction forming an angle of 60° with the normal direction, the transmittance of the coloring layer is about 50% of the maximum transmittance $T_{max}$.

Thus, when the structure shown in Table 1 is employed in the organic EL element OLED, the spectrum of light that has passed through the coloring layer exhibiting the transmittance spectrum shown in FIG. 6 greatly changes according to the traveling direction of light as shown in FIG. 7. That is, in this case, the dependence of hue on the viewing direction is high.

The dependence of hue on the viewing direction can be decreased, for example, by setting the minimum wavelength of light that the green coloring layer passes longer. However, it would be impractical to significantly change the absorption characteristics of the color filter.

In the present embodiment, the resonant wavelength of light that travels within the optical resonator in the normal direction is shifted toward shorter wavelengths. In other words, the wavelength $\lambda_{res}$ of light with the maximum intensity that the organic EL element OLED emits in the normal direction is shifted toward shorter wavelengths. This makes it possible to achieve the same effect as that can be achieved when the minimum wavelength of light that the green coloring layer passes is set longer. That is, the dependence of hue on the viewing direction can be decreased.

For example, the structure shown in Table 2 below is employed in the organic EL element OLED. That is, the thickness of the pixel is changed from 130 nm to 110 nm.

TABLE 2

|  | Refractive index | Thickness (nm) |
| --- | --- | --- |
| Electron transporting layer | 1.7 | 40 |
| Hole blocking layer | 1.7 | 10 |
| Emitting layer | 1.8 | 30 |
| Hole transporting layer | 1.9 | 50 |
| Pixel electrode | 1.9 | 110 |
| Optical length (nm) |  | 443 |

Figure 8:
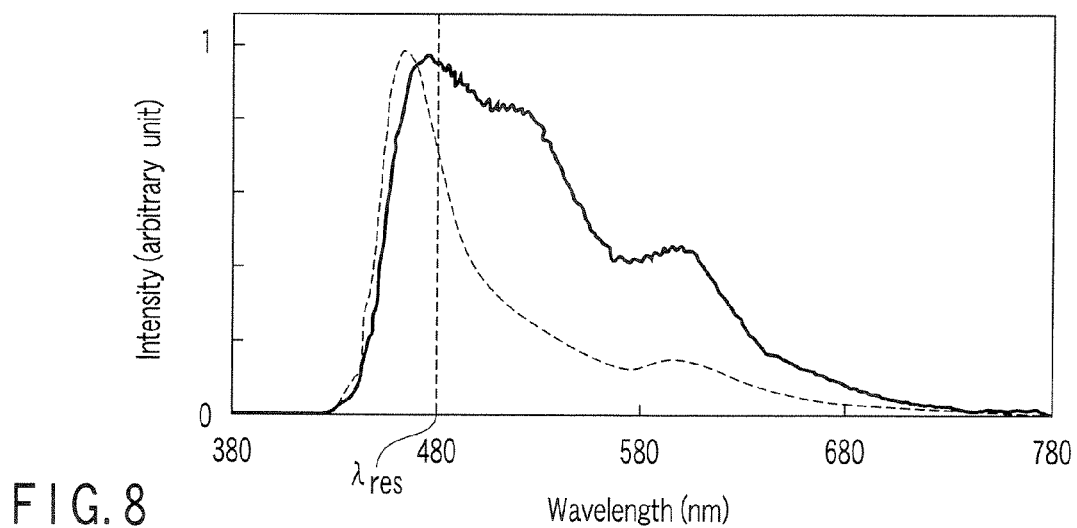
FIG. 8 is a graph showing examples of emission spectrum of the organic EL element shown in FIG. 3 when the structure shown in Table 2 is employed.
Figure 9:
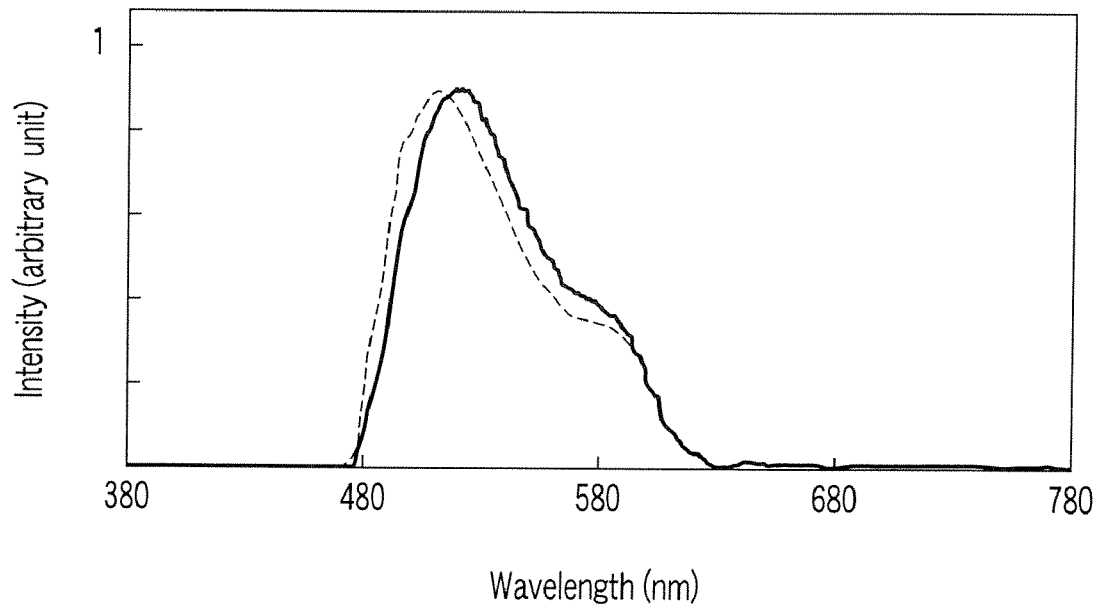
FIG. 9 is a graph showing examples of spectrum of transmitted light when light emitted by the organic EL element employing the structure shown in Table 2 is made to pass through the coloring layer that exhibits the transmission properties shown in FIG. 6.

FIG. 8 is a graph showing examples of emission spectrum of the organic EL element shown in FIG. 3 when the structure shown in Table 2 is employed. FIG. 9 is a graph showing examples of spectrum of transmitted light when light emitted by the organic EL element employing the structure shown in Table 2 is made to pass through the coloring layer that exhibits the transmission properties shown in FIG. 6. In each figure, the abscissa represents a wavelength, while the ordinate represents intensity of light. In FIGS. 8 and 9, the solid line is the spectrum of light traveling in the normal direction, and the broken line is the spectrum of light traveling in the direction that forms an angle of 60° with the normal direction. Also, in FIGS. 8 and 9, the spectrums indicated by the solid line and the broken line are drawn to have the same maximum peak height.

When the structure shown in Table 2 is employed in the organic EL element OLED, the wavelength $\lambda_{res}$ of light with the maximum intensity that the organic EL element OLED emits in the normal direction is 480 nm as shown in FIG. 8, and this wavelength is equal to the resonant wavelength of light traveling within the optical resonator in the normal direction. The resonant wavelength is shorter than the wavelength $\lambda_{max}$ at which the coloring layer exhibits the maximum transmittance $T_{max}$. Therefore, in this case, the dependence of hue on the viewing direction can be decreased as shown in FIG. 9.

As described above, typically, the wavelength $\lambda_{res}$ of light with the maximum intensity that the organic EL element emits in the normal direction is shorter than the wavelength $\lambda_{max}$ at which the coloring layer exhibits the maximum transmittance $T_{max}$ and is equal to or shorter than the wavelength $\lambda_{90}$ at which the coloring layer exhibits the transmittance $T_{90}$, which is 90% of the maximum transmittance $T_{max}$. Under normal circumstances, the above-mentioned effect can be obtained when the wavelength $\lambda_{res}$ is equal to or shorter than the wavelength $\pi_{90}$.

The wavelength $\lambda_{res}$ may be equal to or shorter than the wavelength at which the transmittance of the coloring layer is 75% of the maximum transmittance $T_{max}$. In this case, the dependence of hue on the viewing direction can be decreased to almost zero.

Typically, the wavelength $\lambda_{res}$ of light with the maximum intensity that the organic EL element OLED emits in the normal direction is equal to or longer than the minimum wavelength of light that the coloring layer passes. For example, the wavelength $\lambda_{res}$ may be equal to or longer than the wavelength at which the transmittance of the coloring layer exhibits is 30% of the maximum transmittance $T_{max}$. In this case, it is advantageous in terms of efficiency.

Although the top emission organic EL display is described in this embodiment, the above-mentioned techniques can be applied to a bottom emission organic EL display. In this embodiment, the configuration in which a current signal as a video signal is written on a pixel circuit is employed. Instead, the configuration in which a voltage signal as a video signal is written on a pixel circuit may be employed.

The second embodiment of the present invention will be described below.

Figure 12:
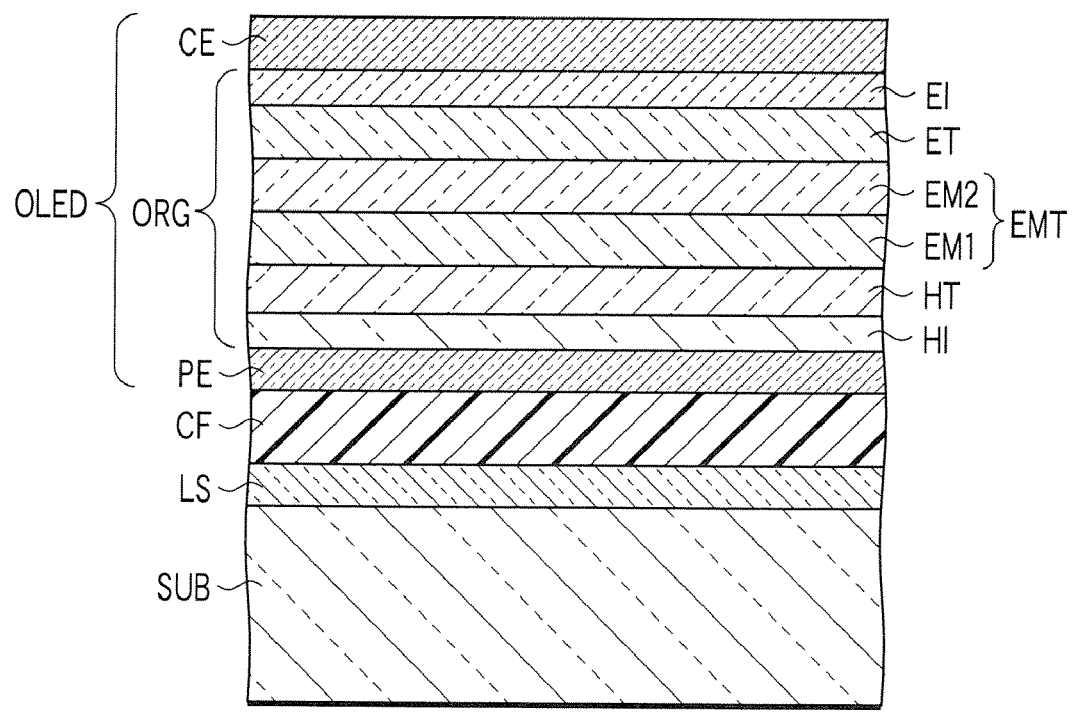
FIG. 12 is a sectional view schematically showing an example of the structure that can be employed in an organic EL element.
Figure 11:
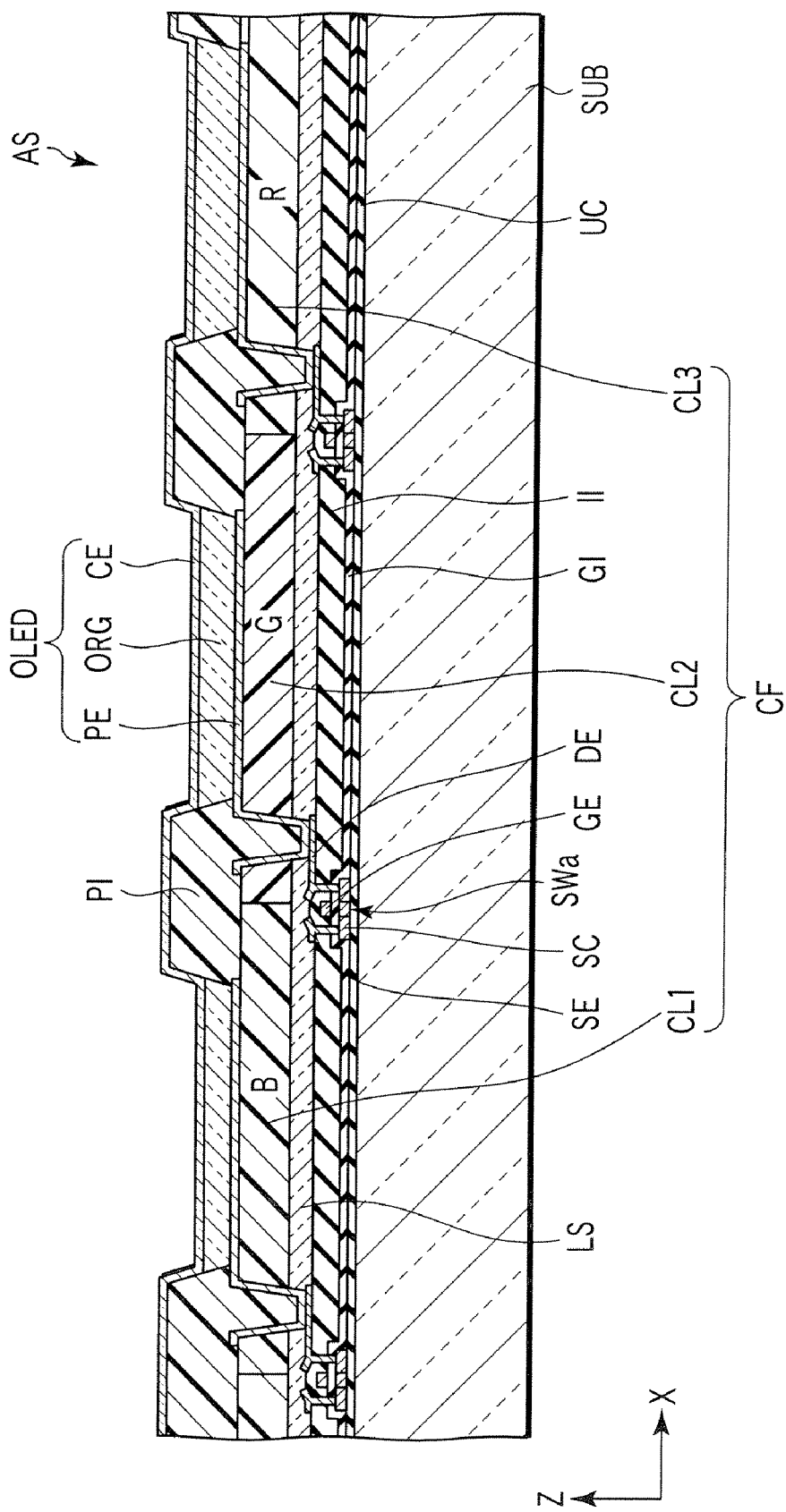
FIG. 11 is a sectional view schematically showing an example of the structure that can be employed in the display shown in FIG. 10.

FIG. 10 is a plan view schematically showing a display according to a second embodiment of the present invention. FIG. 11 is a sectional view schematically showing an example of the structure that can be employed in the display shown in FIG. 10. FIG. 12 is a sectional view schematically showing an example of the structure that can be employed in an organic EL element. In FIG. 10, the display is drawn such that its display surface, i.e., the front surface or light-emitting surface, faces downwardly and its back surface faces upwardly.

The display shown in FIG. 10 is a bottom emission organic EL display that employs an active matrix driving method. As described later, the organic EL display includes pixels PX1 to PX3 different in display color from one another. The pixels PX1 to PX3 include organic EL elements OLED, and further include coloring layers CL1 to CL3 of a color filter CF shown in FIG. 11, respectively.

The organic EL display includes an array substrate AS, a video signal line driver XDR, and a scan signal line driver YDR.

The array substrate AS includes an insulating substrate SUB such as glass substrate.

On the substrate SUB, an undercoat layer UC is formed as shown in FIG. 11. On the undercoat layer UC, semiconductor layers SC are arranged. The undercoat layer UC and the semiconductor layers SC are covered with an insulating film GI. On the insulating film GI, gates GE are arranged correspondently with the semiconductor layers SC. For example, these components are the same as those described in the first embodiment.

The semiconductor layers SC, the insulating film GI and the gates GE form top-gate type p-channel thin-film transistors, which are field-effect transistors. In the present embodiment, as in the first embodiment, the thin-film transistors are p-channel thin-film transistors and utilized as drive control elements DR and switches SWa to SWc shown in FIG. 10.

On the insulating film GI, scan signal lines SL1 and SL2 shown in FIG. 10 and lower electrodes (not shown) are further arranged. The insulating film GI, the gates GE, the scan signal lines SL1 and SL2, and the lower electrodes are covered with an interlayer insulating film II shown in FIG. 11. On the interlayer insulating film II, source electrodes SE and drain electrodes DE shown in FIG. 11, video signal lines DL and power supply lines PSL shown in FIG. 10, and upper electrodes (not shown) are arranged. For example, these components are the same as those described in the first embodiment.

The source electrodes SE, the drain electrodes DE, the video signal lines DL, the power supply lines PSL, and the upper electrodes are covered with a passivation film (not shown). For example, the passivation film is the same as that described in the first embodiment.

On the passivation film, a light-scattering layer LS is formed. The light-scattering layer LS includes, for example, an organic high-molecular material with light transmission properties and light-transmitting particles dispersed therein. The particles differ in optical properties such as refractive index from the organic high-molecular material, and typically made of a light-transmitting inorganic material such as $TiO_2$.

On the light-scattering layer LS, a color filter CF is formed. The color filter CF includes coloring layers CL1 to CL3. The coloring layers CL1 to CL3 are made of an organic high-molecular weight material. The coloring layers CL1 to CL3 forms a stripe pattern, for example.

On the color filter CF, light-transmitting pixel electrodes PE as front electrodes are formed. The pixel electrodes PE are connected to the drain electrodes DE of the switches SWa via through-holes formed in the color filter CF, the light-scattering layer LS and the passivation film. The pixel electrodes PE are anodes in this embodiment. As the material of the pixel electrodes PE, a transparent conductive oxide such as ITO can be used.

On the color filter CF, a partition insulating layer PI shown in FIG. 11 is further formed. For example, the partition insulating layer PI is the same as that described in the first embodiment.

On the pixel electrodes PE, organic layers ORG including white light-emitting layers EMT shown in FIG. 12 are formed as active layers. The white light-emitting layers EMT are thin films designed to emit white light. For example, each emitting layer EMT is a laminated body that includes a yellow light-emitting layer EM1 containing a luminescent organic compound emitting yellow light and a blue light-emitting layer EM2 containing a luminescent organic compound emitting blue light. As shown in FIG. 12, each organic layer ORG can further include a hole injection layer HI, a hole transporting layer HT, an electron transporting layer ET, and an electron injection layer EI in addition to the white light-emitting layer EMT.

The partition insulating layer PI and the organic layers ORG are covered with a counter electrode CE as a back electrode. The counter electrode CE is a common electrode shared among the pixels PX1 to PX3, and is a reflective cathode made of aluminum and the like in the present embodiment. For example, an electrode wire (not shown) is formed on the layer on which the video signal lines DL are formed, and the counter electrode CE is electrically connected to the electrode wire via a contact hole formed in the passivation layer PS, the light-scattering layer LS, the color filter CF and the partition insulating layer PI. Each organic EL element OLED is composed of the pixel electrode PE, organic layer ORG, and counter electrode CE.

The organic EL elements OLED have optical resonator structures, i.e. microcavity structures. In the present embodiment, a configuration in which light emitted by the organic layer ORG causes multi-beam interference between interfaces, i.e., the interface between the pixel electrode PE and the color filter CF and the interface between the counter electrode CE and the organic layer ORG, is employed.

Each organic EL element OLED faces one of the coloring layers CL1 to CL3. Each pixel PX1 includes the organic EL element OLED and the coloring layer CL1 facing the organic EL element OLED. Each pixel PX2 includes the organic EL element OLED and the coloring layer CL2 facing the organic EL element OLED. Each pixel PX3 includes the organic EL element OLED and the coloring layer CL3 facing the organic EL element OLED. Each of the pixels PX1 to PX3 further includes the same pixel circuit as that described in the first embodiment.

The organic EL elements OLED included in the pixels PX1 are shorter in optical length between the color filter CF and the counter electrode CE than the organic EL element OLED included in the pixels PX2. The organic EL elements OLED included in the pixels PX3 are longer in optical length between the color filter CF and the counter electrode CE than the organic EL element OLED included in the pixels PX2. As an example, the differences in the optical length are produced only by making the thickness of the organic layer ORG differ among the pixels PX1 to PX3. Note that the thickness of the pixel electrode PE may be made to differ among the pixels PX1 to PX3 instead of making the thickness of the organic layer ORG differ among the pixels PX1 to PX3.

In the present embodiment, the video signal line driver XDR and the scan signal line driver YDR are placed on the array substrate AS. That is, the video signal line driver XDR and the scan signal line driver YDR are connected to the array substrate AS in the chip-on-glass (COG) manner. Instead, the video signal line driver XDR and the scan signal line driver YDR may be connected to the array substrate AS by using the tape carrier package (TCP).

The display can further include other components such as the sealing substrate CS and the sealing layer described in the first embodiment. The display can be driven by the same method as that described in the first embodiment.

The organic EL display can display an image with high degrees of efficiency and chroma. In addition, the organic EL display is small in the dependence of hue on the viewing direction. This will be described below.

A resonant wavelength of an optical resonator depends on a traveling direction of light. That is, the resonant wavelength of light traveling within an optical resonator in the normal direction differs from the resonant wavelength of light traveling within the optical resonator in the oblique direction.

An emission spectrum of emitting layer included in the organic layer ORG is broad. Thus, it is possible that the wavelength of light with the maximum intensity when the organic EL element OLED is observed in the oblique direction greatly differs from the wavelength of light with the maximum intensity when the organic EL element OLED is observed in the normal direction.

For these reasons, when the light-scattering layer LS is omitted from the organic EL display, the dependence of hue on the viewing direction is large despite the use of the color filter CF, and the dependence of luminance on the viewing direction is large.

In the organic EL display according to the present embodiment, the light-scattering layer LS is placed on the front side of the optical resonators. Therefore, according to the present embodiment, the dependences of hue and luminance on the viewing direction can be decreased.

Note that the dependences of hue and luminance on the viewing direction can be decreased when the light-scattering layer LS is placed between the color filter CF and the pixel electrodes PE. However, in this case, forming the optical resonators is difficult because the pixel electrodes PE and the light-transmitting particles included in the light-scattering layer have almost the same refractive index. Therefore, in this case, it is possible that the degrees of efficiency and chroma are lowered.

When the color filter CF is placed between the microcavity structures and the light-scattering layer LS, it is possible to make light scattered by the light-scattering layer LS without impairing the microcavity effect if the refractive index of the color filter CF is smaller than that of the pixel electrodes PE. Therefore, according to the present embodiment, an image can be displayed with high degrees of efficiency and chroma, and the dependences of luminance and hue on the viewing direction can be decreased.

Typically, the difference between the refractive index of the color filter CF and the refractive index of the pixel electrodes PE is set at a value within a range from 0.3 to 0.6. When the difference between the refractive indices is small, it may be difficult to form the optical resonators. Under normal circumstances, when the color filter CF is made of a commonly-used material, it is difficult to set the difference between the refractive indices at a value larger than 0.6.

Typically, the light-scattering layer LS is placed between the substrate SUB and the color filter CF. When the light-scattering layer LS is placed to face the color filter CF with the substrate SUB interposed therebetween, color mixture may occur due to the thickness of the substrate SUB.

The parts of the light-scattering layer LS corresponding to the pixels PX1, the parts of the light-scattering layer LS corresponding to the pixels PX2, and the parts of the light-scattering layer LS corresponding to the pixels PX3 may be different from one another in the mean diameter of the particles. For example, it is possible that the parts of the light-scattering layer LS corresponding to the pixels PX1 are smaller in the mean diameter of the particles than the parts of the light-scattering layer LS corresponding to the pixels PX2, and the parts of the light-scattering layer LS corresponding to the pixels PX3 are larger in the mean diameter of the particles than the parts of the light-scattering layer LS corresponding to the pixels PX2.

The white light-emitting layer EMT may not be the laminated body of the yellow light-emitting layer EM1 and the blue light-emitting layer EM2. For example, the white light-emitting layer EMT may be a laminated body of a bluish green light-emitting layer and a red light-emitting layer.

The particles contained in the light-scattering layer LS may be metal particles or oxide particles other than $TiO_2$ particles. As the light-scattering layer LS, a photonic crystal layer may be used instead of the light-scattering layer that includes organic high-molecular material with light transmission properties and light-transmitting particles dispersed therein.

Although the bottom emission organic EL display is described in this embodiment, the above-mentioned techniques can be applied to a top emission organic EL display. In this embodiment, the configuration in which a current signal as a video signal is written on a pixel circuit is employed. Instead, the configuration in which a voltage signal as a video signal is written on a pixel circuit may be employed.

The techniques described in the second embodiment may be combined with the techniques described in the first embodiment.

In the second embodiment, the pixels PX1 may emit a shorter wavelength $\lambda_{res}$ of the light component with the maximum intensity that the organic EL element OLED emits in the normal direction as compared with the pixels PX2. In this case, the pixels PX3 emit a longer wavelength $\lambda_{res}$ of the light component with the maximum intensity that the organic EL element OLED emits in the normal direction as compared with the pixels PX2. As an example, it is possible that the wavelength $\lambda_{res}$ of the organic EL elements OLED included in the pixels PX1 falls within the wavelength range of blue light, the wavelength $\lambda_{res}$ of the organic EL elements OLED included in the pixels PX2 falls within the wavelength range of green light, and the wavelength $\lambda_{res}$ of the organic EL elements OLED included in the pixels PX3 falls within the wavelength range of red light.

The coloring layers CL1 may transmit a shorter wavelength $\lambda_{max}$ at which the maximum transmittance $T_{max}$ is obtained as compared to the coloring layers CL2. In addition, the coloring layers CL3 may transmit a longer wavelength $\lambda_{max}$ at which the maximum transmittance $T_{max}$ is obtained as compared to the coloring layers CL2. As an example, it is possible that the wavelength $\lambda_{max}$ at which the coloring layers CL1 exhibit the maximum transmittance $T_{max}$ falls within the wavelength range of blue light, the wavelength $\lambda_{max}$ at which the coloring layers CL2 exhibit the maximum transmittance $T_{max}$ falls within the wavelength range of green light, and the wavelength $\lambda_{max}$ at which the coloring layers CL3 exhibit the maximum transmittance $T_{max}$ falls within the wavelength range of red light. In this case, typically, the wavelength $\lambda_{max}$ is set almost equal to the wavelength $\lambda_{res}$ in each of the pixels PX1 to PX3.

When the techniques described in the first and second embodiments are combined together, an image can be displayed with high degrees of efficiency and chroma, and the dependences of luminance and hue on the viewing direction can be further decreased.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An organic EL display, comprising:
   a first pixel having a first organic EL element and a first coloring layer;
   a second pixel having a second organic EL element and a second coloring layer; and
   a third pixel having a third organic EL element and a third coloring layer,
   wherein each of the first to third coloring layers has a light absorption characteristic, and
   wherein each of the first to third organic EL elements includes a front electrode facing the corresponding coloring layer, a back electrode, and an emitting layer interposed therebetween and having an optical resonator structure, the display being configured such that the first organic EL element emits a light whose maximum intensity wavelength $\lambda_{res}$ in a normal direction is shorter than that of the second organic EL element, the third organic EL element emits a light whose maximum intensity wavelength $\lambda_{res}$ in a normal direction is longer than that of the second organic EL element, a maximum transmittance wavelength $\lambda_{max}$ corresponding to a maximum transmittance $T_{max}$ of the first coloring layer is shorter than that of the second coloring layer, a maximum transmittance wavelength $\lambda_{max}$ corresponding to a maximum transmittance $T_{max}$ of the third coloring layer is longer than that of the second coloring layer, and the wavelength $\lambda_{res}$ of each of the first to third organic EL elements is shorter than the wavelength $\lambda_{max}$ of the corresponding coloring layer.

2. An organic EL display, comprising:
   a first pixel having a first organic EL element and a first coloring layer;
   a second pixel having a second organic EL element and a second coloring layer; and
   a third pixel having a third organic EL element and a third coloring layer,
   wherein each of the first to third organic EL elements includes a front electrode facing the corresponding coloring layer, a back electrode, and an emitting layer interposed therebetween and having an optical resonator structure, the display being configured such that the first organic EL element emits a light whose maximum intensity wavelength $\lambda_{res}$ in a normal direction is shorter than that of the second organic EL element, the third organic EL element emits a light whose maximum intensity wavelength $\lambda_{res}$ in a normal direction is longer than that of the second organic EL element, a maximum transmittance wavelength $\lambda_{max}$ corresponding to a maximum transmittance $T_{max}$ of the first coloring layer is shorter than that of the second coloring layer, a maximum transmittance wavelength $\lambda_{max}$ corresponding to a maximum transmittance $T_{max}$ of the third coloring layer is longer than that of the second coloring layer, and the wavelength $\lambda_{res}$ of each of the first to third organic EL elements is shorter than the wavelength $\lambda_{max}$ of the corresponding coloring layer, wherein the display is configured such that in each of the first to third pixels, the wavelength $\lambda_{res}$ is equal to or shorter than a wavelength $\lambda_{90}$ at which the corresponding coloring layer exhibits a transmittance $T_{90}$,
   the transmittance $T_{90}$ being 90% of the transmittance $T_{max}$, and
   the wavelength $\lambda_{90}$ being shorter than the wavelength $\lambda_{max}$.

3. The display according to claim 1,
   wherein, in each of the first to third pixels, the emitting layer emits white light.

4. The display according to claim 1, wherein
   each of the first to third pixels further comprises a light-scattering layer facing the organic EL element with the coloring layer interposed therebetween.

5. An organic EL display, comprising:
   first to third pixels each comprising an organic EL element having an optical resonator structure and a coloring layer facing the organic EL element, the organic EL element including an emitting layer emitting white light, and the coloring layer having a light absorption characteristic; and
   a light-scattering layer facing the organic EL element with the coloring layer interposed therebetween, the display being configured such that the first pixel emits a light whose maximum intensity wavelength in a normal direction is shorter than the second pixel, and the third pixel emits a light whose maximum intensity wavelength in a normal direction is longer than that of the second pixel, a first organic EL element emits a light whose maximum intensity wavelength $\lambda_{res}$ in a normal direction is shorter than that of a second organic EL element, and a third organic EL element emits a light whose maximum intensity wavelength $\lambda_{res}$ in a normal direction is longer than that of the second organic EL element, and the wavelength $\lambda_{res}$ of each of the first to third organic EL elements is shorter than a wavelength $\lambda_{max}$ at which the corresponding coloring layer exhibits a maximum transmittance $T_{max}$.

6. The display according to claim 5, wherein
   the light-scattering layer contains an inorganic material with light transmission properties.

* * * * *